United States Patent
Hooper et al.

(10) Patent No.: US 8,384,168 B2
(45) Date of Patent: Feb. 26, 2013

(54) SENSOR DEVICE WITH SEALING STRUCTURE

(75) Inventors: Stephen R. Hooper, Mesa, AZ (US); Dwight L. Daniels, Phoenix, AZ (US); James D. MacDonald, Chandler, AZ (US); William G. McDonald, Payson, AZ (US); Chunlin C. Xia, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/091,997

(22) Filed: Apr. 21, 2011

(65) Prior Publication Data

US 2012/0266684 A1    Oct. 25, 2012

(51) Int. Cl.
  *H01L 29/84* (2006.01)
  *G01L 7/08* (2006.01)
(52) U.S. Cl. .................. 257/415; 257/419; 438/51
(58) Field of Classification Search .......... 438/51, 438/52, 53; 257/415, 419, 433
  See application file for complete search history.

(56) References Cited

U.S. PATENT DOCUMENTS

| | | | |
|---|---|---|---|
| 5,668,033 A | 9/1997 | Ohara et al. | |
| 5,804,086 A | 9/1998 | Bruel | |
| 5,889,211 A | 3/1999 | Maudie et al. | |
| 6,769,319 B2 * | 8/2004 | McDonald et al. | 73/866.1 |
| 6,781,231 B2 * | 8/2004 | Minervini | 257/704 |
| 6,845,664 B1 | 1/2005 | Okojie | |
| 6,939,473 B2 | 9/2005 | Nasiri et al. | |
| 7,334,480 B2 | 2/2008 | Silverbrook et al. | |
| 7,518,234 B1 | 4/2009 | Okojie | |
| 7,642,115 B2 * | 1/2010 | Eriksen et al. | 438/51 |
| 7,674,638 B2 | 3/2010 | Okudo et al. | |
| 7,902,843 B2 * | 3/2011 | Fang et al. | 324/686 |
| 7,955,885 B1 * | 6/2011 | Bhugra et al. | 438/51 |
| 8,154,062 B2 | 4/2012 | Park | |
| 2002/0102004 A1 * | 8/2002 | Minervini | 381/175 |
| 2007/0013052 A1 * | 1/2007 | Zhe et al. | 257/704 |
| 2007/0040231 A1 * | 2/2007 | Harney et al. | 257/415 |
| 2007/0205492 A1 * | 9/2007 | Wang | 257/659 |
| 2007/0295456 A1 | 12/2007 | Gudeman et al. | |
| 2008/0022777 A1 | 1/2008 | Tan et al. | |
| 2009/0050990 A1 | 2/2009 | Aono et al. | |
| 2009/0194829 A1 | 8/2009 | Chung et al. | |
| 2010/0052082 A1 | 3/2010 | Lee et al. | |
| 2010/0199777 A1 | 8/2010 | Hooper et al. | |
| 2010/0242603 A1 | 9/2010 | Miller et al. | |
| 2010/0276765 A1 | 11/2010 | Yamamoto et al. | |
| 2011/0126632 A1 | 6/2011 | McNeil et al. | |
| 2011/0165717 A1 | 7/2011 | Lee et al. | |
| 2012/0042731 A1 | 2/2012 | Lin et al. | |
| 2012/0043627 A1 | 2/2012 | Lin et al. | |

OTHER PUBLICATIONS

United States Patent and Trademark Office, Office Action for U.S. Appl. No. 13/092,001, dated Jun. 8, 2012.

* cited by examiner

*Primary Examiner* — Lisa Caputo
*Assistant Examiner* — Punam Roy
(74) *Attorney, Agent, or Firm* — Ingrassia Fisher & Lorenz, P.C.

(57) ABSTRACT

Apparatus and related fabrication methods are provided for a sensor device. The sensor device includes a sensor structure including a first portion having a sensing arrangement formed thereon and a second structure. A sealing structure is interposed between the sensor structure and the second structure, wherein the sealing structure surrounds the first portion of the sensor structure. The sealing structure establishes a fixed reference pressure on a first side of the first portion, and an opposing side of the first portion is exposed to an ambient pressure.

20 Claims, 3 Drawing Sheets

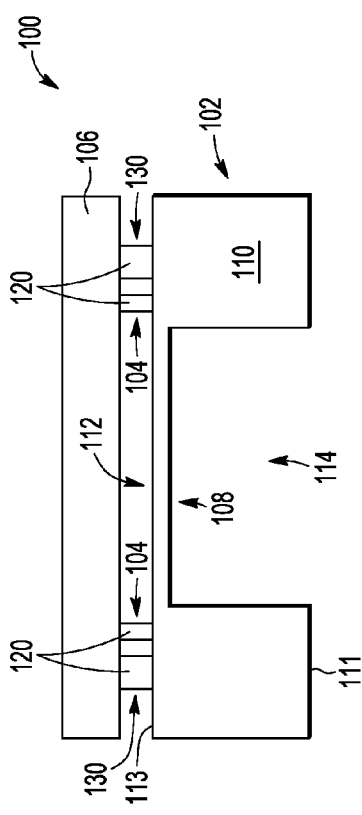
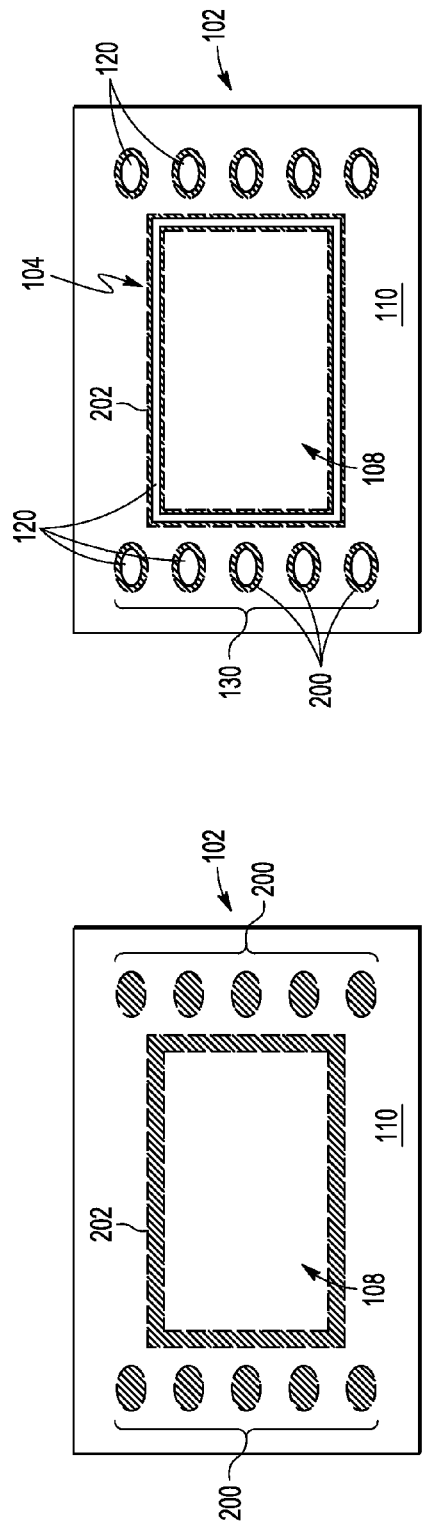

SENSOR DEVICE WITH SEALING STRUCTURE

CROSS-REFERENCE TO RELATED APPLICATIONS

The subject matter described here is related to the subject matter described in U.S. patent application Ser. No. 13/092,001, filed concurrently herewith.

TECHNICAL FIELD

Embodiments of the subject matter described herein relate generally to sensors, and more particularly, embodiments of the subject matter relate to improved packaging for pressure sensors.

BACKGROUND

Microelectromechanical systems (MEMS) are widely used in a variety of sensing applications. For example, a MEMS piezoresistive pressure sensor may be implemented on a semiconductor die to generate electrical signals indicative of the amount of pressure exerted on the semiconductor die (or a portion thereof). Often, these devices are packaged in a manner that provides protection from corrosive elements and helps ensure relatively high reliability over the lifetime of the device so that these devices may be used in harsh operating environments, such as, for example, in an automotive application.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 1 is a cross-sectional view of a sensing system in accordance with one embodiment of the invention;

FIG. 2 is a top view illustrating bonding regions on a topside surface of the sensor structure of the sensing system of FIG. 1 in accordance with one embodiment of the invention;

FIG. 3 is a top view of the sensor structure of FIG. 2 after forming a sealing structure and interconnects on the bonding regions in accordance with one embodiment of the invention;

DETAILED DESCRIPTION

Figure 4:
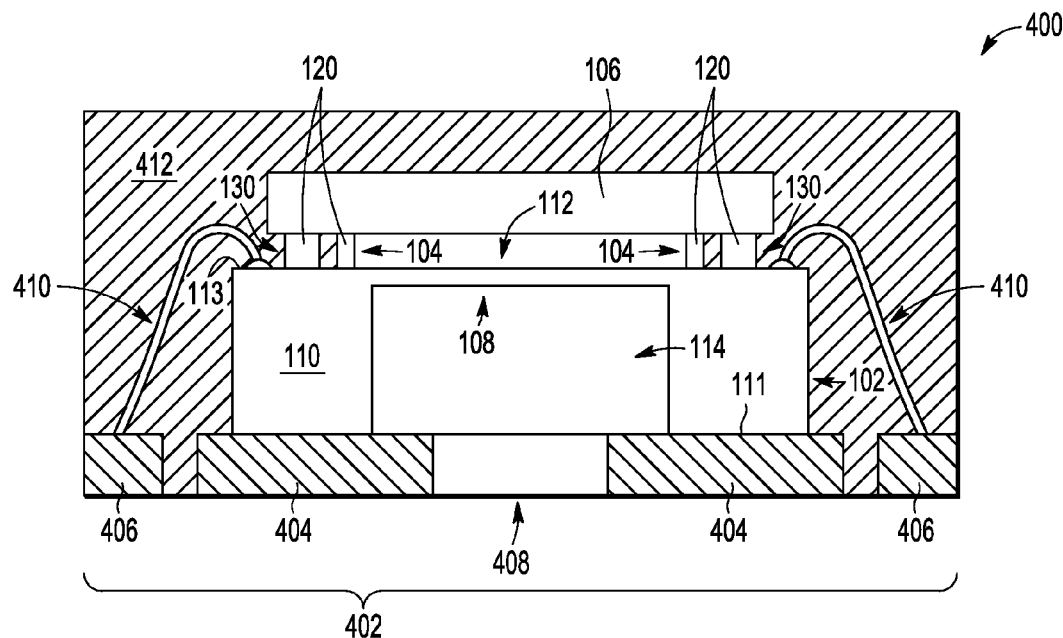
FIG. 4 is a cross-sectional view of a sensor device package suitable for use with the sensing system of FIG. 1 in accordance with another embodiment of the invention.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Technologies and concepts discussed herein relate to sensing devices that utilize a sensing arrangement formed on a diaphragm region of a semiconductor substrate (or die). As described in greater detail below, a sealing structure circumscribes, encompasses, or otherwise surrounds the diaphragm region and provides an airtight seal between the semiconductor substrate of the sensor structure and another structure, such as another semiconductor substrate. In an exemplary embodiment, the sealing structure is realized as a ring or another continuous body of a material that bonds or otherwise affixes the sensor structure and the other structure, resulting in an airtight seal that establishes a fixed pressure on one side of the diaphragm region.

FIG. 1 depicts an exemplary embodiment of a sensing system 100 that includes a sensor structure 102 and a sealing structure 104 interposed between the sensor structure 102 and another structure 106. As described in greater detail below, in an exemplary embodiment, the sensor structure 102 is realized as a microelectromechanical system (MEMS) pressure sensor that includes a pressure sensing arrangement formed on a diaphragm region 108 of a semiconductor substrate 110 (or die). In this regard, the diaphragm region 108 refers to a portion of the semiconductor substrate 110 that is capable of being displaced, deflected, or otherwise moved with respect to the surrounding semiconductor substrate 110. As described in greater detail below, the sealing structure 104 circumscribes or otherwise surrounds the periphery of the diaphragm region 108 and provides an airtight seal between the structures 102, 106 to establish a fixed reference pressure within a chamber 112 between the structures 102, 106 on one side of the diaphragm region 108, while the opposing side of the diaphragm region 108 is exposed to ambient pressure.

In an exemplary embodiment, the semiconductor substrate 110 is realized as a monocrystalline silicon material that is exposed to one or more semiconductor fabrication process steps to define the diaphragm region 108. In this regard, a surface 111 of the semiconductor substrate 110 may be etched in a conventional manner to form a cavity 114 (or opening) in the semiconductor substrate 110 while leaving the interior diaphragm region 108 intact between the surrounding portions of the semiconductor substrate 110 that are not etched. For convenience, the surface 111 of the semiconductor substrate 110 etched to form the cavity 114 may alternatively be referred to herein as the backside surface (or backside) of the pressure sensor structure 102, while the opposing surface 113 of the semiconductor substrate 110 may alternatively be referred to herein as the topside surface (or topside) of the pressure sensor structure 102.

As set forth above, in an exemplary embodiment, a pressure sensing arrangement is formed on the topside surface 113 of the diaphragm region 108 opposite the cavity 114. The pressure sensing arrangement is configured to generate or otherwise produce electrical signals that are influenced by the amount of displacement or deflection of the diaphragm region 108, and thus, are indicative of the amount of pressure exerted on the diaphragm region 108 by the cavity 114 relative to the fixed reference pressure exerted on the diaphragm region 108 by the sealed chamber 112. For example, in accordance with one embodiment, the pressure sensing arrangement may be realized as four piezoresistive elements configured in a Wheatstone bridge, wherein the displacement or deflection of the diaphragm region 108 influences the resistances of the piezoresistive elements to produce a corresponding change in the voltage difference between a pair of output nodes of the Wheatstone bridge. The piezoresistive elements may be formed in a conventional manner, for example, by implanting ions of a desired conductivity type into the topside of the diaphragm region 108 to form doped regions resistances that vary with respect to the deflection of the diaphragm region 108. In an exemplary embodiment, the output nodes of the Wheatstone bridge are electrically connected to corresponding output terminals to provide an output voltage signal that is indicative of the pressure applied to the diaphragm region 108 by the ambient pressure in the cavity 114.

As best illustrated by FIG. 2, in an exemplary embodiment, each output terminal of the pressure sensing arrangement is realized as a conductive bonding region 200 (or bonding pad) formed on the topside surface 113 of the semiconductor substrate 110 that is electrically connected to the sensing arrangement. The bonding regions 200 are also electrically connected to corresponding bonding pads on the structure 106 by a conductive interconnect 130, as described in greater detail below. Additionally, the topside surface 113 of the pressure sensor die 110 also includes a bonding region 202 (alternatively referred to herein as a bonding ring) that circumscribes or otherwise surrounds the periphery of the diaphragm region 108 and facilitates bonding the sealing structure 104 to the pressure sensor die 110, as described in greater detail below. In this regard, FIG. 2 illustrates a top view of the pressure sensor structure 102 prior to bonding or otherwise affixing the sealing structure 104 and interconnects 130 to the topside surface 113 of the pressure sensor die 110. As illustrated, the perimeter of the bonding region 202 is greater than the perimeter of the diaphragm region 108. In an exemplary embodiment, the bonding regions 200, 202 are realized as the same material, such as silicon, and may be formed on the pressure sensor die 110 at the same time. For example, a dielectric material may be formed overlying the topside surface 113 of the pressure sensor structure 102, and portion of the dielectric material may be selectively removed (e.g., by etching) to expose the bonding regions 200, 202 of the underlying silicon material of the semiconductor substrate 110. In some embodiments, the bonding pads 200 and/or bonding ring 202 may be realized as metal traces formed on the topside surface 113 of the pressure sensor die 110.

Referring again to FIG. 1, in an exemplary embodiment, the structure 106 is realized as a semiconductor substrate (or die) having an application specific integrated circuit (ASIC) or other control circuitry formed thereon that interfaces with the pressure sensor structure 102 to measure or otherwise determine the magnitude of the ambient pressure in the cavity 114 that is applied to the diaphragm region 108, as described in greater detail below. In this regard, the ASIC or control circuitry is configured to convert the output electrical signal from the pressure sensing arrangement formed on the diaphragm region 108 (e.g., the voltage difference between output nodes of the Wheatstone bridge) to a corresponding pressure metric and perform additional tasks and/or functions associated with the operation of the pressure sensor structure 102. Depending on the embodiment, the semiconductor substrate 106 may include one or more processors (or microprocessors), one or more controllers (or microcontrollers), and/or other hardware, processing logic, circuitry or components formed thereon. For convenience, but without limitation, the semiconductor substrate 106 may alternatively be referred to herein as the integrated circuit die or ASIC die, and the semiconductor substrate 110 may alternatively be referred to herein as the pressure sensor die. In an exemplary embodiment, the surface of ASIC die 106 adjacent to the pressure sensor die 110 (e.g., the lower surface in FIG. 1) includes conductive bonding pads (or contact pads) that function as input/output terminals for providing and/or receiving electrical signals to/from the pressure sensing arrangement on the pressure sensor die 110 and/or other devices or components external to the pressure sensing system 100. The bonding pads on the ASIC die 106 are electrically connected to corresponding bonding pads 200 on the topside surface 113 of the pressure sensor die 110 via interconnects 130, as described in greater detail below. Additionally, the ASIC die 106 includes a bonding region (or bonding ring) that corresponds to the sealing structure 104, as described in greater detail below. In this regard, the bonding regions on the ASIC die 106 mirror the bonding regions on the topside surface 113 of the pressure sensor die 110.

Referring now to FIG. 3, and with continued reference to FIGS. 1-2, in an exemplary embodiment, the sealing structure 104 is realized as a ring or another continuous body of a nonporous material 120 that defines a hollow interior that is substantially aligned with the diaphragm region 108, and the sealing structure 104 circumscribes or otherwise surrounds the periphery of the diaphragm region 108 to create an airtight sealed chamber 112 between the dies 106, 110 along the topside of the diaphragm region 108. In this manner, the chamber 112 has a fixed pressure that may be used as a reference pressure when measuring the ambient pressure applied to the backside of the diaphragm region 108. In an exemplary embodiment, the sealing structure 104 is realized as a metal material that is bonded or otherwise affixed to both the topside surface 113 of the pressure sensor die 110 and the adjacent surface of the ASIC die 106 to provide the airtight seal. In this regard, in an exemplary embodiment, the bonding regions on the ASIC die 106 and/or the pressure sensor die 110 are realized as a material capable of being eutectically bonded to the metal material 120 of the sealing structure. For example, in accordance with one or more embodiments, the metal material 120 of the sealing structure 104 is realized as gold, aluminum, or another metal material that is deposited or otherwise plated on the bonding ring 202, thereby forming a chemical bond between the metal material 120 and the bonding ring 202. In this regard, FIG. 3 illustrates a top view of the pressure sensor structure 102 after forming the sealing structure 104 bonded to the pressure sensor die 110. Afterwards, the metal material 120 of the sealing structure 104 is eutectically bonded to the bonding pad on the adjacent surface of the ASIC die 106 that corresponds to or otherwise mirrors bonding ring 202. In this manner, the dies 106, 110 are affixed or otherwise bonded together by the metal material 120 of the sealing structure 104. As best illustrated by FIGS. 1 and 3, the perimeter of the sealing structure 104 is greater than the perimeter of the diaphragm region 114 such that the metal material 120 that provides the sealing structure 104 circumscribes or otherwise surrounds the diaphragm region 108, and the bonds between the metal material 120 and the dies 106, 110 result in the chamber 112 being hermetically sealed. In another embodiment, the metal material 120 of the sealing structure 104 is deposited or otherwise plated on the ASIC die 106 to form a chemical bond between the metal material 120 and the ASIC die 106 before eutectically bonding the metal material 120 to the bonding ring 202 on the pressure sensor die 110. In other embodiments, the sealing structure 104 may be formed and then eutectically bonded to the pressure sensor die 110 and the surface of the ASIC die 106 contemporaneously. In other words, the dies 106, 110 may be concurrently bonded to the sealing structure 104 as part of the same process step.

Still referring to FIG. 1-3, in an exemplary embodiment, the interconnects 130 are realized as the same metal material 120 utilized for the sealing structure 104 and the bonding pads 200 utilized for the interconnects 130 are realized as the same material as the bonding ring 202 for the sealing structure 104, such that the interconnects 130 between the dies 106, 110 may be formed as part of the same process step used to bond the sealing structure 104 to the dies 106, 110. For example, in accordance with one embodiment, the interconnects 130 may be realized as a gold material that is plated or otherwise deposited on the bonding pads 200 to bond the interconnects 130 to the pressure sensor die 110, and the interconnects 130 are subsequently bonded to corresponding bonding pads on the ASIC die 106 at the same time as the sealing structure 104 is bonded to the ASIC die 106. Alternatively, the interconnects 130 may be formed on the ASIC die 106 and subsequently bonded to the pressure sensor die 110. It should be noted that in other embodiments, the interconnect bonding pads 200 may be realized as a material different from the material used for the sealing structure bonding ring 202 and/or the interconnects 130 may be realized using a conductive material different from the material used for the sealing structure 104, but in such embodiments, the interconnects 130 may still be bonded to the dies 106, 110 at the same time as the sealing structure 104. In the illustrated embodiments of FIGS. 1 and 3, the conductive interconnects 130 are disposed outside the perimeter of the sealing structure 104, however, in other embodiments, the conductive interconnects may be disposed inside the perimeter of the sealing structure 104 but outside of the perimeter of the diaphragm region 108.

In an exemplary embodiment, the dies 106, 110 are eutectically bonded together in a vacuum chamber, such that the sealed chamber 112 established by the sealing structure 104 is at vacuum (e.g., the fixed reference pressure corresponds to vacuum). As described above, in one or more embodiments, the metal material 120 is bonded to the pads 200 and bonding ring 202 on the topside surface 113 of the pressure sensor die 110 (either inside or outside of a vacuum chamber), and subsequently, the pressure sensor die 110 may be transferred to a vacuum chamber and the sealing structure 104 and interconnects 130 bonded thereto may then be eutectically bonded to the ASIC die 106 to provide the sealed vacuum chamber 112. In yet another alternative embodiment, the metal material 120 may be first bonded to the ASIC die 106 (either inside or outside of a vacuum chamber) to form the sealing structure 104, and subsequently, the ASIC die 106 may be transferred to a vacuum chamber and the sealing structure 104 affixed thereto may then be bonded to the pressure sensor die 110 to provide the sealed vacuum chamber 112.

It should be understood that FIGS. 1-3 depict a simplified representation of a sensing system 100 for purposes of explanation and ease of description, and FIGS. 1-3 are not intended to limit the scope of the application or the subject matter described herein in any way. In this regard, although the subject matter is described herein in the context of the pressure sensor die 110 being bonded to the ASIC die 106 in die form, in practical embodiments, the sensing system 100 may be formed using wafers that are subsequently diced to obtain the pressure sensor die 110 and the ASIC die 106. For example, as described in greater detail below in the context of FIG. 4, a wafer having multiple instances of the pressure sensor structure 102 formed thereon may be affixed to a wafer including multiple instances of ASICs or other control circuitry configured to support operation of the pressure sensor structure 102 formed thereon, and then diced to obtain multiple instances of the sensing system 100 illustrated in FIG. 1.

FIG. 4 depicts an exemplary embodiment of a flat no lead sensor device package 400 for packaging the sensing system 100 of FIG. 1. After bonding the dies 106, 110 in the manner described above in the context of FIGS. 1-3 to form the sealed vacuum chamber 112, the ASIC die 106 is sawn (e.g., by performing a saw-to-reveal process prior to dicing) to expose peripheral portions of the topside surface 113 of the pressure sensor die 110 that are used for forming conductive wire bonds 410 to/from the pressure sensor die 110, as described in greater detail below. Fabrication of the pressure sensor device package 400 continues by affixing, bonding, or otherwise mounting the backside surface 111 of the pressure sensor die 110 to a lead frame structure 402, for example, by using an epoxy or silicone adhesive to adhere them together. In an exemplary embodiment, the pressure sensor die 110 is affixed or otherwise bonded to the interior die flag portion 404 of the lead frame structure 402. In this regard, the die flag 404 includes a hole 408 formed therein, and the pressure sensor die 110 is positioned on the die flag 404 such that the hole 408 is substantially aligned with and/or centered with respect to the diaphragm region 108 to provide a pressure vent that allows ambient pressure surrounding the pressure sensor device package 400 to enter the cavity 114 and interface with the diaphragm region 108.

As illustrated, conductive wire bonds 410 are formed between locations on the exposed peripheral portions of the topside surface 113 of the pressure sensor die 110 and the lead portions 406 of the lead frame structure 402 to provide electrical connections between the dies 106, 110 and the leads 406. In this manner, electrical signals may be provided to and/or received from the pressure sensing arrangement on the pressure sensor die 110 and/or the ASIC formed on the ASIC die 106 at the leads 406. It should be noted that although not illustrated, the topside surface 113 of the pressure sensor die 110 is utilized to route signals between the interconnects 130 and the wire bonds 410 to provide appropriate electrical interconnections between the dies 106, 110 and the leads 406. In this regard, in some embodiments, some of the interconnects 130 and bonding pads 200 may be utilized exclusively for routing signals from/to the leads 406 to/from the ASIC die 106.

After forming the wire bonds 410, a molding compound 412, such as a thermosetting epoxy molding compound, is formed overlying the dies 106, 110 (e.g., by transfer molding) to encapsulate the dies 106, 110 and the wire bonds 410. In this regard, the molding compound 412 fills any spaces between the dies 106, 110 that are outside of the sealed chamber 112 and protects the circuitry and/or components on the surfaces of the dies 106, 110 from environmental elements. As illustrated, the molding compound is disposed between the pressure sensor die 110 and the ASIC die 106 and surrounds the sealing structure 104, which, in turn, prevents the molding compound 412 from penetrating or otherwise interfering with the sealed chamber 112 and thereby maintains the sealed chamber 112 at vacuum after the dies 106, 110 have been encapsulated by the molding compound 412.

The pressure sensor device package 400 of FIG. 4 may be mounted to a circuit board or another electronics substrate to interface with other electrical components and/or systems, as will be appreciated in the art. In this regard, the circuit board (or electronics substrate) having the pressure sensor device package 400 mounted thereto preferably includes a corresponding hole or pressure vent that is substantially aligned with the hole 408 or otherwise configured to allow the ambient pressure surrounding the pressure sensor device package 400 to enter the cavity 114 via hole 408 to deflect or otherwise influence the diaphragm region 108.

In accordance with one or embodiments, fabrication of the pressure sensor device package 400 is accomplished by forming bonding regions (or pads) on the topside surface of the pressure sensor wafer (e.g., the wafer to be diced to obtain pressure sensor die 110) and the lower surface of the ASIC wafer (e.g., the wafer to be diced to obtain ASIC die 106) and then eutectically bonding the wafers together. For example, silicon bonding pads may be formed on the wafers at locations corresponding to the locations of the input/output terminals on the respective dies 106, 110, and silicon bonding rings formed surrounding the respective diaphragm regions 108. After forming the silicon bonding regions, interconnects 130 and sealing structures 104 may be formed on the pressure sensor wafer by plating or otherwise depositing gold (e.g., metal material 120) on the silicon bonding pads. After forming the sealing structures 104 and interconnects 130 on the pressure sensor wafer, fabrication of the pressure sensor device package 400 continues by placing the pressure sensor wafer and the ASIC wafer in a vacuum chamber, aligning the bonding regions on the lower surface of the ASIC wafer with the gold material 120 on the pressure sensor wafer, and pressing the wafers together while heating the vacuum chamber to eutectically bond the gold material 120 on the pressure sensor wafer to the bonding pads on the ASIC wafer (e.g., thermal compression bonding). In this manner, the sealing structures 104 create airtight seals and define vacuum chambers 112 on the topside of the respective diaphragms regions 108 concurrently to forming interconnects 130. After the wafers are bonded, portions of the ASIC wafer are removed by performing a saw-to-reveal process to expose regions of the pressure sensor wafer that will be used for attaching wire bonds 410, and then the ASIC wafer and the pressure sensor wafer are diced to obtain pressure sensor dies 110 that are eutectically bonded to a respective ASIC die 106. Fabrication of the pressure sensor device package 400 may then be completed by affixing or otherwise bonding the backside surface 111 of the pressure sensor die 110 to the lead frame structure 402, forming wire bonds 410 between the leads 406 and the pressure sensor die 110, and applying or otherwise forming the thermosetting epoxy molding compound 412 on top of the dies 106, 110.

One advantage of the pressure sensor device package 400 of FIG. 4 is that by virtue of the ASIC die 106 being affixed to the pressure sensor die 110, the area footprint of the pressure sensor device package 400 is reduced. At the same time, by virtue of the ASIC die 106 being substantially planar, the height of the pressure sensor device package 400 is not significantly increased. Furthermore, there is no need for wire bonds or other routing between the dies 106, 110 other than interconnects 130.

Figure 5:
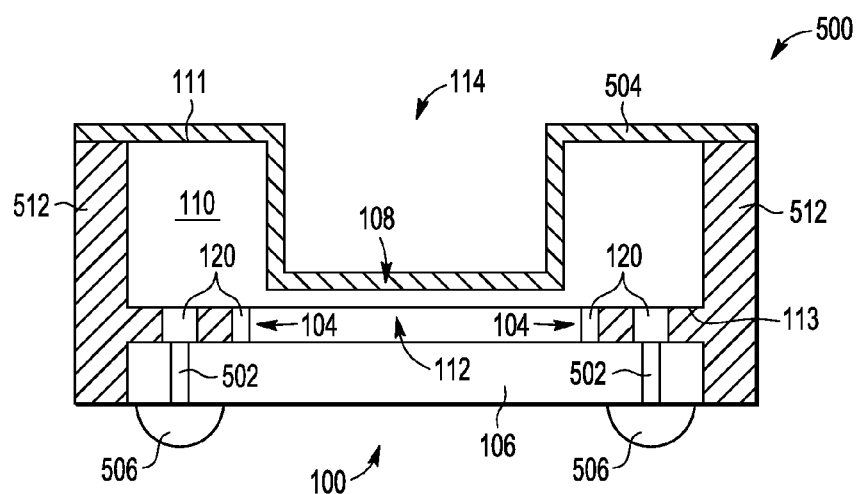
FIG. 5 is a cross-sectional view of another sensor device package suitable for use with the sensing system of FIG. 1 in accordance with another embodiment of the invention.

FIG. 5 depicts another embodiment of a sensor device package 500 for packaging the sensing system 100 of FIG. 1. In the illustrated embodiment of FIG. 5, one or more conductive interconnects 502 (or vias) are formed in the ASIC die 106 that provide electrical connections to one or more of the interconnects 130. After bonding the dies 106, 110 in the manner described above in the context of FIGS. 1-3 to form the sealed vacuum chamber 112, a molding compound 512, such as a thermosetting epoxy molding compound, is formed that surrounds the dies 106, 110 in a similar manner as described above in the context of FIG. 4. The molding compound 512 is prevented from being formed in the cavity 114 or otherwise being formed on the backside surface 111 of the pressure sensor die 110 or the opposite surface of the ASIC die 106. After the molding compound 512 is formed, a layer of a protective material 504 is formed on the backside surface 111 of the pressure sensor die 110. The protective material 504 is preferably a chemically-resistant material, such as parylene, that is deposited on the backside surface 111 of the pressure sensor die 110 and the surrounding molding compound 512 by vacuum deposition or another suitable deposition process. In this manner, the protective material 504 and molding compound 512 encapsulate the pressure sensor structure 102 to protect the pressure sensor structure 102 from environmental elements. In an exemplary embodiment, the thickness of the layer of protective material 504 is less than about 10 microns, such that the protective material 504 formed on the diaphragm region 108 does not appreciably deflect or otherwise influence deflection of the diaphragm region 108.

In the illustrated embodiment, solder balls 506 are formed on the exposed surface of the ASIC die 106 that are in contact with or otherwise aligned with the vias 502. The solder balls 506 may be utilized to subsequently mount the pressure sensor device package 500 to a circuit board or another electronics substrate to interface with other electrical components and/or systems, as will be appreciated in the art. In this manner, the backside surface 111 of the pressure sensor structure 102, and thus the cavity 114, is exposed to the ambient pressure that surrounds the pressure sensor device package 500, while the opposing surface of ASIC die 106 (e.g., the lower surface in FIG. 2) is protected by the circuit board. It should be noted that electrical signals from the pressure sensor die 110 that need to be accessed by electrical components external to the pressure sensor device package 500 may be routed to such external components by the interconnects 130, 502, the ASIC die 106 and/or the circuit board.

In accordance with one or more embodiments, fabrication of the pressure sensor device package 500 is achieved by initially bonding the dies 106, 110 together in wafer form as described above in the context of the fabrication of pressure sensor device package 400. In accordance with one embodiment, after the wafers are bonded, the wafers are diced to obtain pressure sensor dies 110 that are eutectically bonded to ASIC dies 106, and the thermosetting epoxy molding compound 512 is formed between the dies 106, 110. After forming the thermosetting epoxy molding compound 512, fabrication of the package 500 continues by conformably depositing the protective material 504 on the backside surface 111 of the pressure sensor die 110 and the surrounding mold compound 512 by vacuum deposition (e.g., physical vapor deposition). It will be appreciated that the mold compound 512 may affix neighboring bonded pairs of dies 106, 110 obtained from the wafers, such that the dies 106, 110 are diced or otherwise singulated again after depositing the protective material 504 to separate bonded pairs of dies 106, 110 from neighboring bonded pairs of dies 106, 110 obtained from the wafers. In accordance with another embodiment, after the wafers are bonded, the protective material 504 is conformably deposited on the backside surface 111 of the pressure sensor wafer before dicing the wafers. After dicing the wafers, the thermosetting epoxy molding compound 512 is formed between the dies 106, 110 and the dies 106, 110 are diced or otherwise singulated again to separate bonded pairs of dies 106, 110 from neighboring bonded pairs of dies 106, 110 obtained from the wafers. Depending on the embodiment, the solder balls 506 may be formed on the ASIC dies 106 either before or after dicing the ASIC wafer.

One advantage of the pressure sensor device package 500 of FIG. 5 is that by virtue of the ASIC die 106 being affixed to the pressure sensor die 110, the area footprint of the pressure sensor device package 500 is reduced. At the same time, by virtue of the ASIC die 106 being substantially planar, the height of the pressure sensor device package 500 is not significantly increased. Furthermore, there is no need for wire bonds or other routing between the dies 106, 110 other than interconnects 130. Additionally, the pressure sensor device package 500 does not require a lead frame, wire bonds, or other components and/or circuitry to interface with a circuit board (or another electronics substrate), although it will be appreciated that in practice, the solder balls 506 may be used to mount the pressure sensor device package 500 to another electronics substrate or semiconductor substrate (e.g., an interposer) before being mounted to a circuit board. The protective material 504 also provides resistance to chemicals or other environmental elements, thereby allowing the pressure sensor device package 500 to be utilized in harsh environments.

Figure 6:
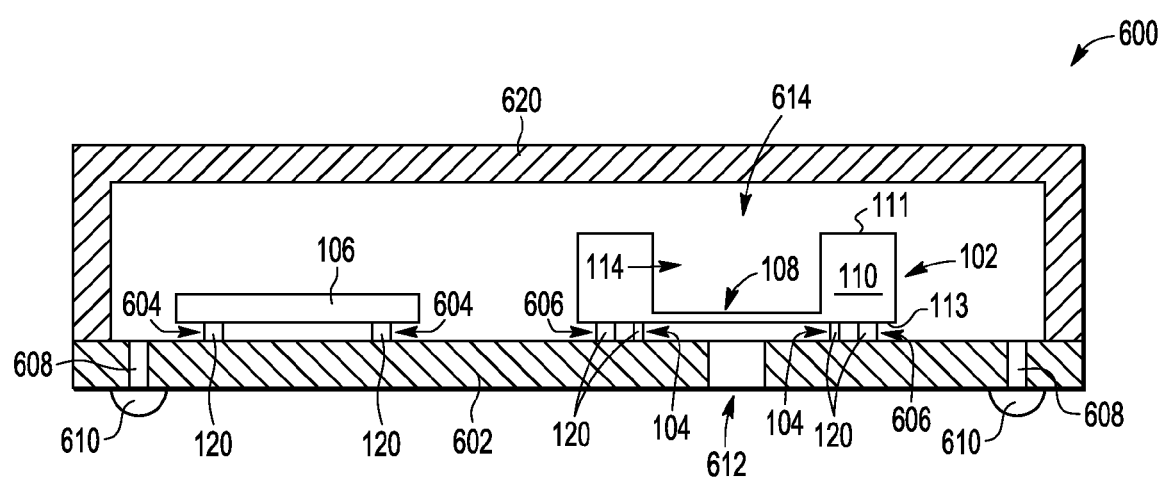
FIG. 6 is a cross-sectional view of another sensor device package in accordance with another embodiment of the invention.

FIG. 6 depicts another embodiment of a sensor device package 600 suitable for packaging a sensing system that includes the pressure sensor structure 102, the sealing structure 104, and the ASIC die 106. In this embodiment, the ASIC die 106 is not bonded or otherwise affixed to the sealing structure 104 or the pressure sensor die 110. Rather, the sensor device package 600 of FIG. 6 includes an interposer structure 602 having the dies 106, 110 bonded, affixed, or otherwise mounted thereto, wherein the sealing structure 104 is positioned between the topside surface 113 of the pressure sensor die 110 and the interposer structure 602 and thereby bonds or otherwise affixes the pressure sensor die 110 and the interposer structure 602. As described above, the sealing structure 104 is realized as a metal material 120, which may also be used to form interconnects 604, 606 between the dies 106, 110 and the interposer structure 602. In this regard, the metal material 120 bonds both dies 106, 110 to the interposer structure 602, wherein the ASIC die 106 is affixed to the interposer structure 602 by interconnects 604 and the pressure sensor die 110 is affixed to the interposer structure 602 by the sealing structure 104 and interconnects 606.

In an exemplary embodiment, the interposer structure 602 is realized as an electronics substrate that is configured to route electrical signals between the dies 106, 110 to provide an electrical connection between the control circuitry formed on the ASIC die 106 and the sensing arrangement formed on the pressure sensor die 110 as well as to/from electrical systems or components external to the pressure sensor device package 600. For example, depending on the embodiment, the interposer structure 602 may be realized as a semiconductor substrate, such as a silicon substrate, or another suitable electronics substrate, such as a glass substrate or a ceramic substrate. As illustrated, the interposer structure 602 includes conductive interconnects 608 (or vias) formed therein, and solder balls 610 are formed on or otherwise aligned with the vias 608 to provide electrical connections to/from the dies 106, 110. As described above in the context of FIG. 5, the solder balls 610 may be utilized to mount the pressure sensor device package 600 to a circuit board or another electronics substrate to interface with other electrical components and/or systems, as will be appreciated in the art. In an exemplary embodiment, the interposer structure 602 includes a hole 612 formed therein, wherein the pressure sensor die 110 is positioned with respect to the interposer structure 602 such that the hole 612 is substantially aligned with and/or centered with respect to the topside of the diaphragm region 108 to provide a pressure vent that allows ambient pressure surrounding the pressure sensor device package 600 to interface with the topside of the diaphragm region 108. As described above in the context of FIG. 4, the circuit board (or electronics substrate) having the pressure sensor device package 600 mounted thereto preferably includes a corresponding hole or pressure vent that is substantially aligned with the hole 612 or otherwise configured to allow the ambient pressure surrounding the pressure sensor device package 600 to deflect or otherwise influence the diaphragm region 108.

In an exemplary embodiment, after bonding or otherwise affixing the dies 106, 110 to the interposer structure 602, a capping member 620 that overlies and covers the dies 106, 110 is bonded, affixed, or otherwise mounted to the surface of the interposer structure 602 to define a hermetically sealed chamber 614. For example, a capping member 620 may be realized as a glass or ceramic lid structure that is hermetically sealed to the interposer structure 602 using solder or glass frit to form an airtight seal to the interposer structure 602. As described above, the sealing structure 104 also provides an airtight seal between the topside surface 113 of the pressure sensor die 110 and the interposer structure 602, such that the chamber 614 is sealed by the sealing structure 104 and the capping member 620 to establish a fixed pressure on the backside surface 111 of the pressure sensor die 110 that may be used as a reference pressure. In an exemplary embodiment, the capping member 620 is bonded to the interposer structure 602 in a vacuum chamber, such that the chamber 614 defined by the sealing structure 104 and the capping member 620 is at vacuum. In this manner, the backside of the diaphragm region 108 is exposed to the vacuum reference pressure, while the topside of the diaphragm region 108 is exposed to the ambient pressure that surrounds the pressure sensor device package 600.

In accordance with one or more embodiments, fabrication of the pressure sensor device package 600 begins by forming bonding regions on the interposer wafer (e.g., a wafer containing multiple instances of interposer structure 602), the topside surface of the pressure sensor dies 110 and the lower surface of the ASIC dies 106. After forming bonding regions on the interposer wafer, interconnects 604, 606 and sealing structures 104 may be formed on the interposer wafer, for example, by plating or otherwise depositing the metal material 120 on the bonding regions to form sealing structures 104 and interconnects 604, 606 chemically bonded to the interposer wafer. Fabrication of the sensor device package 600 continues by aligning the bonding regions on the topside surface 113 of the pressure sensor dies 110 and/or the bonding regions on the lower surface of the ASIC dies 106 with the metal material 120 on the interposer wafer, and compressing the respective dies 106, 110 to the interposer wafer while applying heat (e.g., thermal compression bonding) to eutectically bond the metal material 120 on the interposer wafer to the bonding regions on the ASIC die 106 and/or pressure sensor die 110. In this regard, it should be noted that the dies 106, 110 may be bonded to the interposer wafer concurrently or independently at different times, depending on the needs of a particular embodiment. After bonding the dies 106, 110 to the interposer wafer, in an exemplary embodiment, solder, glass frit, or another material capable of providing a hermetic seal is formed or otherwise applied about the perimeters of the respective interposer structures 602 on the interposer wafer. The interposer wafer is then placed in a vacuum chamber, and a structure that includes multiple instances of the capping member 620 (e.g., a wafer of capping members) is aligned with the hermetically sealing material about the perimeters of the interposer structures, and the interposer wafer and the capping member structure are compressed to bond or otherwise affix the capping members 620 to the interposer structures 602 and provide airtight vacuum chambers 614 on the backside of the pressure sensor dies 110. After affixing the capping members 620 to the interposer structures 602, the solder balls 610 are formed on the interposer wafer, and the interposer wafer and capping member structure are diced to obtain instances of pressure sensor device package 600.

One advantage of the pressure sensor device package 600 of FIG. 6 is that the pressure sensor structure 102 is bonded to the interposer structure 602 by the sealing structure 104 in a manner that establishes a reference pressure in conjunction with the capping member 620, such that the pressure sensor structure 102 does not need a constraint wafer on the backside of the die 110. The capping member also provides protection from environmental elements, thereby allowing the pressure sensor device package 600 to be utilized in harsh environments. Additionally, the dies 106, 110 are not bonded together, allowing them to be fabricated, diced, and bonded to the interposer structure 602 independently of one another.

For the sake of brevity, conventional techniques related to MEMS devices, pressure sensing, piezoresistive pressure sensors and/or related calibration methods, voltage sensing, semiconductor and/or integrated circuit fabrication, device packaging, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context.

In conclusion, systems, devices, and methods configured in accordance with example embodiments of the invention relate to:

An exemplary apparatus for a sensor device is provided. The sensor device includes a sensor structure including a first portion having a sensing arrangement formed thereon, a second structure, and a sealing structure interposed between the sensor structure and the second structure. The sealing structure surrounds the first portion of the sensor structure to establish a fixed reference pressure on a first side of the first portion, wherein a second side of the first portion opposite the first side is exposed to an ambient pressure. In one embodiment, the sealing structure comprises a metal material bonded to the sensor structure and the second structure to provide an airtight seal between the sensor structure and the second structure. In a further embodiment, the second structure has a planar surface, wherein the metal material is bonded to the planar surface. In another embodiment, the sealing structure defines a vacuum chamber on the first side of the first portion. In accordance with another embodiment, the fixed reference pressure is at vacuum. In yet another embodiment, the sensor device includes a conductive interconnect disposed between the sensor structure and the second structure, wherein the sealing structure and the conductive interconnect each comprise a metal material bonded to the sensor structure and the second structure. The conductive interconnect is electrically connected to the sensing arrangement. In another embodiment, the second structure comprises an integrated circuit die having the control circuitry formed thereon, wherein the control circuitry is configured to determine a pressure metric indicative of the ambient pressure based on an electrical signal from the sensing arrangement. In a further embodiment, a conductive interconnect is disposed between the sensor structure and the integrated circuit die to provide an electrical connection between the control circuitry and the sensing arrangement. In accordance with another embodiment, the first portion deflects in response to a difference between the ambient pressure and the fixed reference pressure. In yet another embodiment, the sensor structure comprises an integrated circuit die, the first portion comprises a diaphragm region of the integrated circuit die, the sensing arrangement is formed on the first side of the diaphragm region, and the sealing structure defines a vacuum chamber on the first side of the first portion.

In another exemplary embodiment, an apparatus for a pressure sensor device includes a pressure sensor structure including a diaphragm region having a sensing arrangement formed on a first side of the pressure sensor structure, a metal material bonded to the first side of the pressure sensor structure and circumscribing the diaphragm region, and a substrate having a planar surface, wherein the metal material is bonded to the planar surface of the substrate to establish a chamber having a fixed reference pressure. In one embodiment, the chamber is disposed on the first side of the diaphragm region and a second side of the diaphragm region is exposed to an ambient pressure. In a further embodiment, the substrate comprises a semiconductor substrate having an application-specific integrated circuit formed thereon, wherein the application-specific integrated circuit is coupled to the sensing arrangement to determine a pressure metric indicative of the ambient pressure based on an electrical signal from the sensing arrangement. In yet another embodiment, the sensing arrangement comprises a plurality of piezoresistive elements formed on the diaphragm region, the resistances of the piezoresistive elements is influenced by deflection of the diaphragm region, and the electrical signal is influenced by the resistances of the plurality of piezoresistive elements. In another embodiment, a protective material is formed on the second side of the diaphragm region. In yet another embodiment, a molding compound is disposed between the pressure sensor structure and the substrate, such that the molding compound surrounds the metal material. In accordance with yet another embodiment, the fixed reference pressure is at vacuum.

Another exemplary embodiment of a sensor device includes a sensor structure including a diaphragm region having a sensing arrangement formed thereon, a substrate, a sealing structure bonded to a first side of the sensor structure and the substrate, and a capping member bonded to the substrate. The sealing structure circumscribes the diaphragm region on the first side of the sensor structure, the capping member covers the sensor structure to establish a fixed reference pressure on a second side of the sensor structure, and the substrate includes a hole formed therein, wherein the diaphragm region is aligned with the hole to expose the first side of the diaphragm region to an ambient pressure. In one embodiment, an integrated circuit die is bonded to the substrate, wherein the integrated circuit die includes control circuitry to determine a pressure metric indicative of the ambient pressure based on an electrical signal from the sensing arrangement and the substrate provides an electrical connection between the sensing arrangement and the control circuitry.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A sensor device comprising:
   a sensor structure including a first portion having a sensing arrangement formed thereon;
   control circuitry to determine a pressure metric indicative of the ambient pressure based on an electrical signal from the sensing arrangement;
   a second structure comprising an integrated circuit die having the control circuitry formed thereon; and a sealing structure interposed between the sensor structure and the second structure, the sealing structure surrounding the first portion of the sensor structure to establish a fixed reference pressure on a first side of the first portion, wherein a second side of the first portion is exposed to an ambient pressure.

2. The sensor device of claim 1, wherein the sealing structure comprises a metal material bonded to the sensor structure and the second structure to provide an airtight seal between the sensor structure and the second structure.

3. The sensor device of claim 2, the second structure having a planar surface, wherein the metal material is bonded to the planar surface.

4. The sensor device of claim 1, wherein the sealing structure defines a vacuum chamber on the first side of the first portion.

5. The sensor device of claim 1, wherein the fixed reference pressure is at vacuum.

6. The sensor device of claim 1, further comprising a conductive interconnect disposed between the sensor structure and the second structure, wherein the sealing structure and the conductive interconnect each comprise a metal material bonded to the sensor structure and the second structure.

7. The sensor device of claim 6, wherein the conductive interconnect is electrically connected to the sensing arrangement.

8. The sensor device of claim 1, further comprising a conductive interconnect disposed between the sensor structure and the integrated circuit die to provide an electrical connection between the control circuitry and the sensing arrangement.

9. The sensor device of claim 1, wherein the first portion deflects in response to a difference between the ambient pressure and the fixed reference pressure.

10. The sensor device of claim 1, wherein:
the sensor structure comprises a second integrated circuit die;
the first portion comprises a diaphragm region of the second integrated circuit die;
the sensing arrangement is formed on the first side of the diaphragm region; and
the sealing structure defines a vacuum chamber on the first side of the first portion.

11. A pressure sensor device comprising:
a pressure sensor structure including a diaphragm region having a sensing arrangement formed on a first side of the pressure sensor structure, wherein a second side of the diaphragm region is exposed to an ambient pressure;
a metal material circumscribing the diaphragm region, the metal material being bonded to the first side of the pressure sensor structure; and
a substrate having a planar surface, wherein the metal material is bonded to the planar surface of the substrate to establish a chamber on the first side of the diaphragm region having a fixed reference pressure, wherein the substrate comprises a semiconductor substrate having an application-specific integrated circuit formed thereon, the application-specific integrated circuit being coupled to the sensing arrangement to determine a pressure metric indicative of the ambient pressure based on an electrical signal from the sensing arrangement.

12. The pressure sensor device of claim 11, wherein:
the sensing arrangement comprises a plurality of piezoresistive elements formed on the diaphragm region, resistances of the piezoresistive elements being influenced by deflection of the diaphragm region; and
the electrical signal is influenced by the resistances of the plurality of piezoresistive elements.

13. A pressure sensor device comprising:
a pressure sensor structure including a diaphragm region having a sensing arrangement formed on a first side of the pressure sensor structure, wherein a second side of the diaphragm region is exposed to an ambient pressure;
a metal material circumscribing the diaphragm region, the metal material being bonded to the first side of the pressure sensor structure;
a substrate having a planar surface, wherein the metal material is bonded to the planar surface of the substrate to establish a chamber on the first side of the diaphragm region having a fixed reference pressure; and
a protective material formed on the second side of the diaphragm region.

14. The sensor device of claim 13, further comprising a molding compound surrounding the pressure sensor structure and the substrate.

15. A pressure sensor device comprising:
a pressure sensor structure including a diaphragm region having a sensing arrangement formed on a first side of the pressure sensor structure;
a metal material circumscribing the diaphragm region, the metal material being bonded to the first side of the pressure sensor structure;
a substrate having a planar surface, wherein the metal material is bonded to the planar surface of the substrate to establish a chamber having a fixed reference pressure; and
a molding compound disposed between the pressure sensor structure and the substrate, the molding compound surrounding the metal material.

16. The pressure sensor device of claim 15, wherein:
the chamber is disposed on the first side of the diaphragm region; and
a second side of the diaphragm region is exposed to an ambient pressure.

17. The pressure sensor device of claim 15, wherein the fixed reference pressure is at vacuum.

18. The sensor device of claim 15, wherein the molding compound encapsulates the pressure sensor structure and the substrate.

19. A sensor device comprising:
a sensor structure including a cavity and a diaphragm region having a sensing arrangement formed thereon;
a substrate;
a sealing structure bonded to a first side of the sensor structure and the substrate, the sealing structure circumscribing the diaphragm region on the first side of the sensor structure; and
a capping member bonded to the substrate, the capping member covering the sensor structure to establish a fixed reference pressure on a second side of the sensor structure, wherein the substrate includes a hole formed therein, the diaphragm region being aligned with the hole to expose the first side of the diaphragm region opposite the cavity to an ambient pressure.

20. The sensor device of claim 19, further comprising an integrated circuit die having formed thereon control circuitry to determine a pressure metric indicative of the ambient pressure based on an electrical signal from the sensing arrangement, the integrated circuit die being bonded to the substrate and the substrate providing an electrical connection between the sensing arrangement and the control circuitry.

* * * * *